United States Patent [19]
Ryu et al.

[11] Patent Number: 5,712,821
[45] Date of Patent: Jan. 27, 1998

[54] REDUNDANCY CIRCUIT OF SEMICONDUCTOR MEMORY DEVICE

[75] Inventors: Douk Hyoun Ryu; Taek Moo Kim, both of Kyoungkido, Rep. of Korea

[73] Assignee: Hyundai Electronics Industries Co. Ltd., Kyoungkido, Rep. of Korea

[21] Appl. No.: 673,524

[22] Filed: Jul. 1, 1996

[30] Foreign Application Priority Data

Jun. 30, 1995 [KR] Rep. of Korea ............... 1995-19166

[51] Int. Cl.$^6$ ........................................ G11C 8/00
[52] U.S. Cl. ............... 365/200; 365/189.07; 365/230.06
[58] Field of Search .......................... 365/200, 201, 365/189.07, 189.08, 230.06

[56] References Cited

U.S. PATENT DOCUMENTS

| | | | |
|---|---|---|---|
| 4,723,227 | 2/1988 | Murotani | 365/200 |
| 4,817,056 | 3/1989 | Furutani et al. | 365/200 |
| 5,289,416 | 2/1994 | Iwai et al. | 365/200 |
| 5,297,088 | 3/1994 | Yamaguchi | 365/200 |
| 5,517,138 | 5/1996 | Baltar et al. | 365/200 |
| 5,539,698 | 7/1996 | Suzuki | 365/200 |
| 5,550,776 | 8/1996 | Seo et al. | 365/200 |
| 5,579,266 | 11/1996 | Tahara | 365/200 |

*Primary Examiner*—Tan T. Nguyen
*Attorney, Agent, or Firm*—Jacobson, Price, Holman & Stern, PLLC

[57] ABSTRACT

A redundancy circuit of a semiconductor memory device is provided, including: a plurality of repairing word lines for repairing the normal word line connected to a failed cell; a plurality of repairing paths for selecting a random repairing word line of the repairing word lines; and at least one comparing means for enabling at least two repairing word lines in case the respective paths corresponding to the same address on the normal decoding path and the repairing path are simultaneously enabled, whereby the normal word line of the failed cell is simultaneously enabled with at least two repairing word lines.

8 Claims, 4 Drawing Sheets

REDUNDANCY CIRCUIT OF SEMICONDUCTOR MEMORY DEVICE

BACKGROUND OF THE INVENTION

The present invention relates to a redundancy circuit for a semiconductor memory device for repairing a failed cell, and more particularly, to a redundancy circuit capable of performing a high speed operation and preventing an error during a repairing operation.

Generally, in manufacturing a semiconductor memory device, for the case that one of a plurality of arrayed cells fails, a repairing operation is performed, in which a word line or bit line of the failed cell is replaced with a spare word line or bit line through a redundancy circuit, instead of discarding the entire chip.

FIG. 1 is a block diagram showing a repairing path of a conventional row word line. Conventionally, in case of repairing a normal word line of a failed cell, a repairing path 4 selects a repairing word line by using a signal input from a repairing decoder, and then outputs the selected repairing signal to a normal decoding path 3 which is connected to a normal word line in order not to select the normal word line.

As illustrated in the drawing, the normal decoding path 3 includes a NAND gate 1 which receives a repairing signal and a signal output from the normal decoder, and an inverter connected between the NAND gate and the normal word line.

As described above, in the conventional art, because the repairing word line is first selected and then the repairing signal is output to the normal decoding path 3 to cut off the normal decoding path, a timing difference is generated between the normal decoding signal applied to the normal decoding path 3 and the repairing signal output from the repairing path 4, producing a delaying time which causes a repairing error.

SUMMARY OF THE INVENTION

Therefore, an object of the invention is to provide a redundancy circuit of a semiconductor memory device which can prevent a delaying time generated from a repairing signal and the thus-generated repairing error.

To achieve the object, in a redundancy circuit of a semiconductor memory device having a plurality of normal word lines and a plurality of normal decoding paths for selecting one of the plurality of normal word lines, the circuit of the invention includes: a plurality of repairing word lines for repairing the normal word line connected to a failed cell; a plurality of repairing paths for selecting a random repairing word line of the repairing word lines; and at least one comparing means for enabling at least two repairing word lines in case the respective paths corresponding to the same address on the normal decoding path and the repairing path are simultaneously enabled, whereby the normal word line of the failed cell is simultaneously enabled with at least two repairing word lines.

BRIEF DESCRIPTION OF THE ATTACHED DRAWINGS

DETAILED DESCRIPTION OF PREFERRED EMBODIMENT

Figure 1:
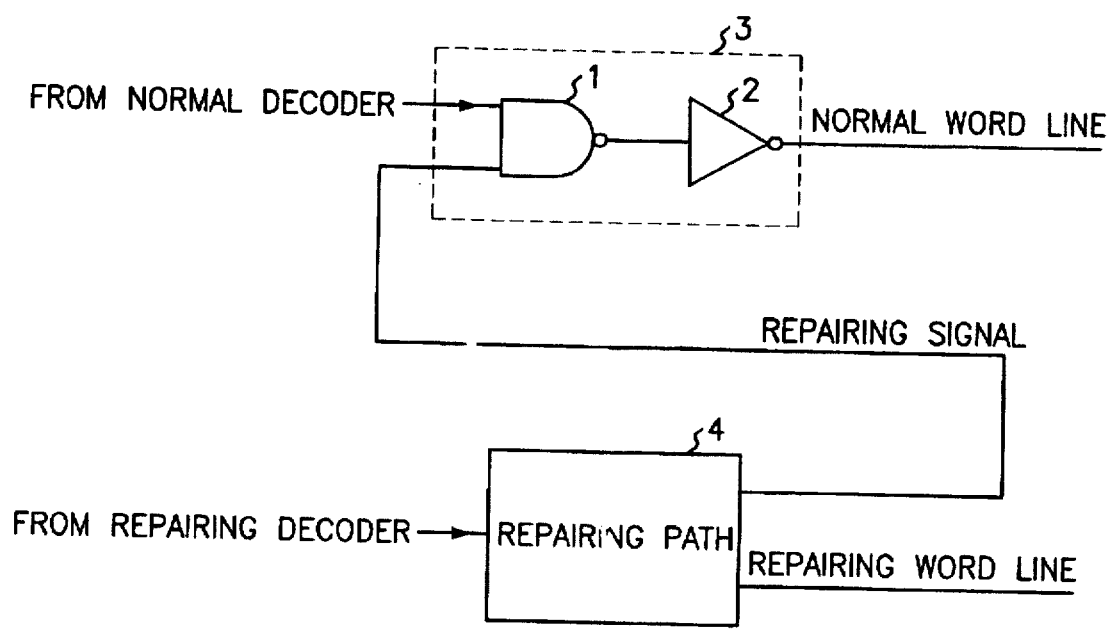
FIG. 1 is a block diagram showing a redundancy path of a conventional circuit.
Figure 2:
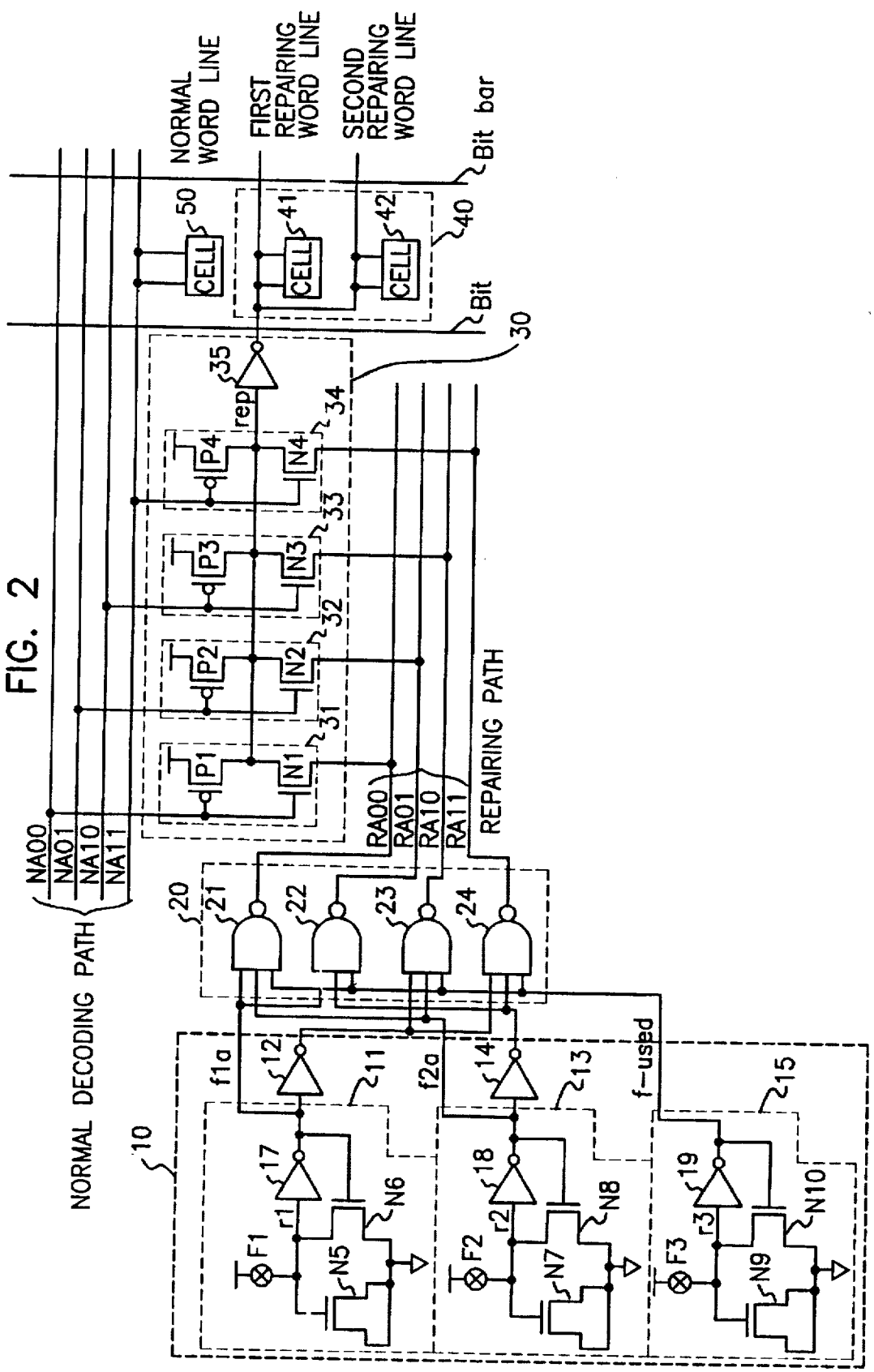
FIG. 2 is a circuit diagram of a redundancy circuit with two addresses according to one embodiment of the invention.
Figure 4:
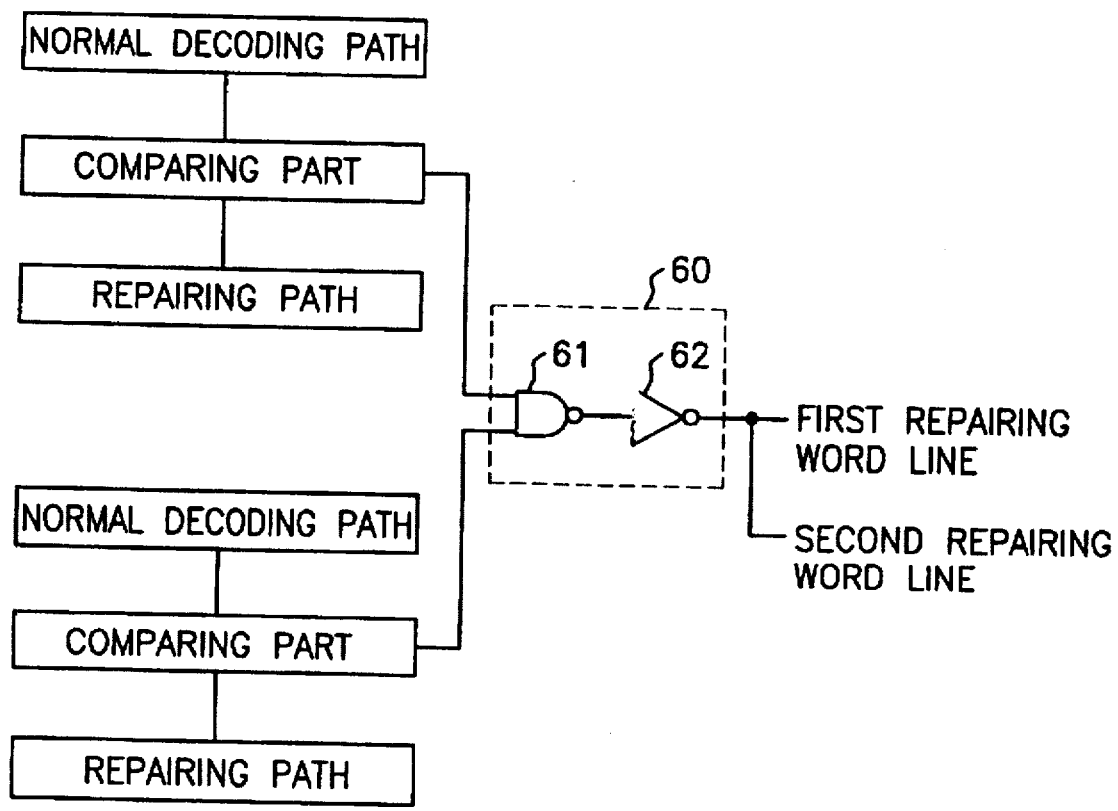
FIG. 4 is a detailed circuit diagram of the repairing word line selection decoder of FIG. 3.

With reference to FIGS. 2 and 4, one embodiment of the invention will be described as follows.

FIG. 2 illustrates a row redundancy circuit of SRAM for realizing a repairing operation according to an embodiment of the invention. Namely, the circuit diagram shows the case that the entire chip has two addresses.

As illustrated in the drawing, a comparing part 30 is formed between a normal decoding path and a repairing path which have the same address as each other. A repairing word line part 40 connected to the repairing path can be selected, only when the normal decoding path and the repairing path, respectively connected by a comparing part 30, are enabled with each other.

Because the normal word line is selected simultaneously with the repairing word line part 40, the repairing word line part 40 prevents the memory device from making an error during the writing/reading operation, by simultaneously selecting a first and second repair word lines.

The redundancy address generating part 10 and a repairing decoder part 20 are circuit blocks for enabling one path of the repairing paths through a fuse-cutting operation. In the embodiment of the invention, the repairing path is enabled by a logic signal "LOW".

As illustrated in the drawing, the comparing part 30 according to one embodiment of the invention includes PMOS transistors P1 to P4 each having a gate terminal which receives a signal of the normal decoding path, and a channel formed between a supply voltage and an output terminal (rep); and an NMOS transistors N1 to N4 each having a gate terminal for receiving an input signal of the normal decoding path, and a channel formed between the output terminal (rep) and the repairing path.

The redundancy address generating part 10 is made up with fuse circuit parts 11, 13, 15 and inverters 12 and 14 for inverting the outputs of the fuse circuit parts 11 and 13. The part 10 outputs the outputs of the fuse circuit parts 11, 13, 15 and the inverters 12, 14 to the repairing decoder part 20. The fuse circuit parts 11, 13, 15 each have a fuse F1, F2, F3 one terminal of which is connected to the supply voltage; NMOS transistors N5, N6, N7 each having a gate terminal connected to the Other side of the fuse and drain/source terminal connected to the ground terminal; NMOS transistors N6, N8, N10 each having a drain terminal connected to the other terminal of the fuse F1, F2, F3, and a source terminal connected to the ground terminal; inverters 17, 18, 19 each having an input terminal connected to the other terminal of the fuses F1, F2, F3, and output terminal connected to the gate terminal of the NMOS transistors N6, N8, N10.

Here, an output of one fuse circuit part 15 among the plurality of fuse circuit parts is input to all NAND gate terminals 21 through 24 forming the repairing decoder without passing through the inverters, and thus generating a repair enable signal for enabling any repairing paths.

That is, in case of starting the repairing operation, the fuse of the fuse circuit 15 is first cut off, and then one fuse of the rest fuse circuits is also cut off to determine the repairing path.

The redundancy repairing decoder part 20 according to the embodiment of the invention is made up with a plurality of NAND gates 21 through 24 for performing a NAND operation with any signals which are output to the redundancy address generating part 10, and then enabling one repairing path.

An operation of the thus-structured redundancy circuit will be described below.

For example, it is suggested that a failure is generated in a normal cell 50, and therefore the word line connected to the cell 50 is repaired by the repairing operation of the invention.

First, a fuse F3 of the fuse circuit is cut off to enable the redundancy circuit. After the fuse F3 is cut off, a low level signal is applied to a node r3, and a high level signal is applied to a node (f-used), so that all the repairing paths are in the low state by the NAND gates 21, 22, 23, 24. Next, according to the cut-off of the fuses F1, F2, F3 of the redundancy address generating parts, the repairing paths RA00, RA01, RA10, RA00 become the state where only one repairing path becomes a low level, and the rest repairing paths are at a high level. And if the fuse F2 is cut off to repair the word line connected to the cell 50, only the repairing path RA11 is enabled to a low level, which is in response to the normal decoding path NA11 corresponding to the word line connected to the cell 50.

Then, if an address in response to the normal decoding path NA11 is applied to the chip in the state where the repairing path RA11 is at a low level, the normal decoding path NA11 becomes a high level, so that the node (ref) becomes a low level by the comparing part 34, and the output of the inverter 35 becomes a high level to thereby enable the first and second repairing word lines. Additionally, if the bit line (bit, bit-bar) corresponding to the normal cell 50 is enabled, the repair cells 41 and 42 are also respectively enabled.

Figure 3:
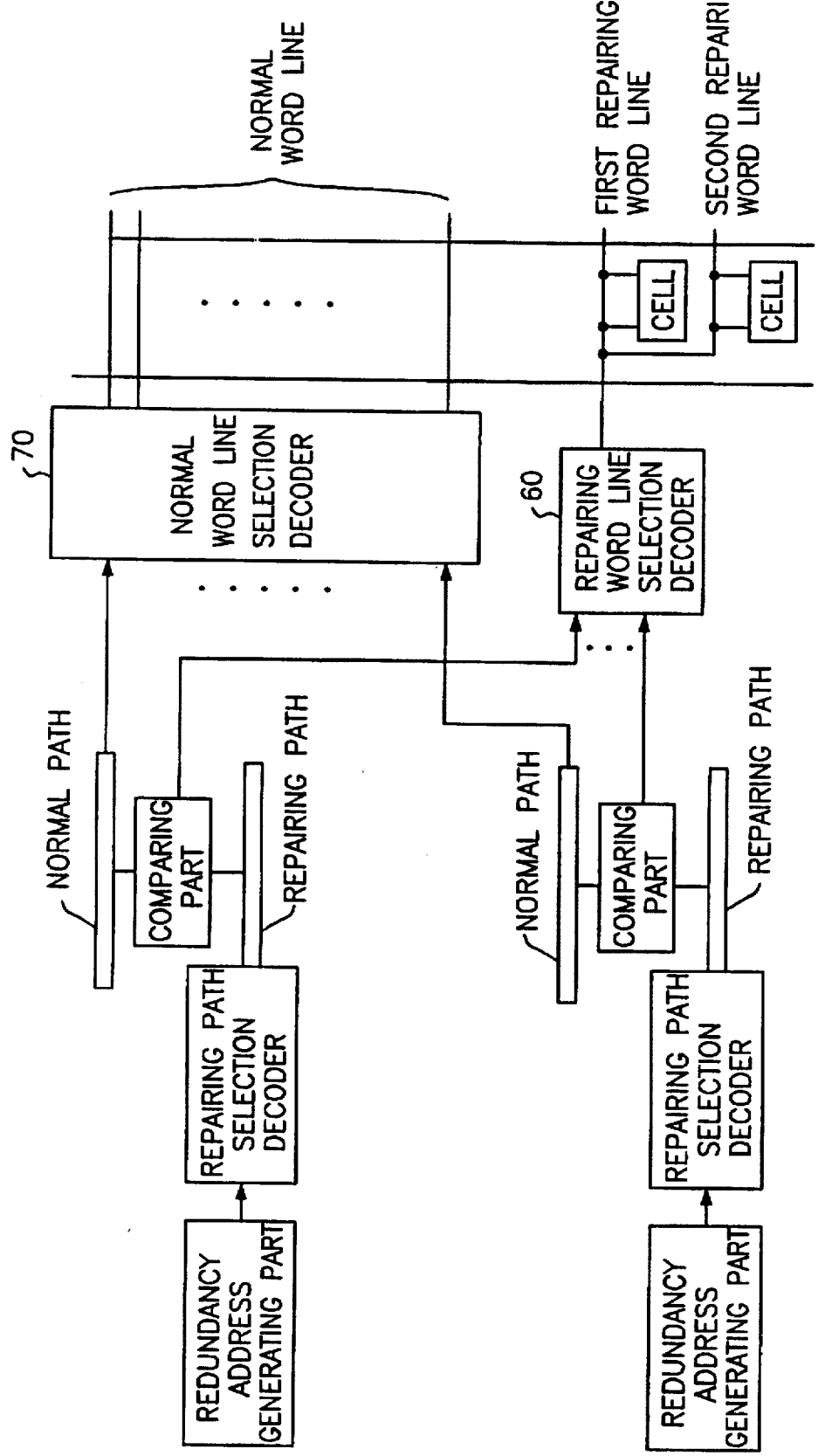
FIG. 3 is a block diagram of the redundancy circuit with more than two addresses of the present invention.

FIG. 3 is a block diagram of the redundancy circuit having more than two addresses of the invention.

Even though 1 mega RAM has $2^{10}$ rows, but actually the 1024 normal decoding paths cannot be formed because of its integration, and therefore the normal word line selection decoder 70, which decodes by receiving the signal of each normal decoding path and then selects the normal word line, is realized to solve the above problem. And the repairing path also cannot be formed of more than thousands of lines due to its integration, so that the repairing word line is formed with four word lines, as illustrated in the drawing. Therefore, the output of each comparing part is decoded to form a repairing word line selection decoder 60 for selecting the first and second repairing word lines.

FIG. 4 is a detailed circuit diagram of the repairing word line selection decoder 60. The decoder 60 has a NAND gate 61 which receives the two signals output from the two comparing parts whose respective addresses are four in total; and an inverter 62 for inverting the output of the NAND gate. The decoder 60 selects the first and second repairing word lines.

As described above, the invention simultaneously enables at least two repairing word lines with the normal word line of the failed cell, rather than cutting off the normal word line of the failed cell, to thereby overwrite the failed cell.

That is, at the state where the normal cell 50 is repaired with the cells 41 and 42, if the failed cell 50 always has the value "0", and the value "0" is used for the repair cell, signal "0" of the cell is applied to a bit line cell. And in case the value "1" is used for the repair cell, signal "1" of the cell is applied to the bit line.

The above-mentioned invention performs the repairing operation without cutting off the normal decoding path, and thereby reducing its delaying time and preventing its repairing error.

While there have been illustrated and described what are considered to be preferred embodiments of the present invention, it will be understood by those skilled in the art that various changes and modifications may be made, and equivalents may be substituted for elements thereof without departing from the true scope of the present invention.

What is claimed is:

1. A redundancy circuit of a semiconductor memory device having a plurality of normal word lines and a plurality of normal decoding paths for selecting one of said plurality of normal word lines, said circuit comprising:

a plurality of repairing word lines for repairing said normal word line connected to a failed cell;

a plurality of repairing paths for selecting a random repairing word line of said repairing word lines; and at least one comparing means for enabling at least two repairing word lines in case the respective paths corresponding to the same address on said normal decoding path and said repairing path are simultaneously enabled, whereby the normal word line of the failed cell is simultaneously enabled with at least two repairing word lines.

2. The circuit as claimed in claim 1, wherein said comparing means comprises:

a plurality of unit comparing means which comprises:

a first MOS transistor having a gate receiving a signal of one normal decoding path and a channel formed between a supply voltage and an output terminal;

a second MOS transistor having a channel between a repairing path having the same address as said normal decoding path and said output terminal, and a gate terminal for receiving a signal of said normal decoding path; and inverting means for inverting the output of said unit comparing means and then applying it to said repairing word line.

3. The circuit as claimed in claim 1, further comprising redundancy address generating means for generating a redundancy address by a fuse cutting.

4. The circuit as claimed in claim 3, further comprising repairing path selection decoding means for enabling one repairing path line according to a redundancy address output from said redundancy address generating means.

5. The circuit as claimed in claim 4, further comprising repairing word line selection decoding means for selecting at least two repairing word lines by decoding the outputs of said comparing means.

6. The circuit as claimed in claim 5, wherein said repairing word line selection decoding means comprises:

a NAND gate for performing a NAND operation with the signals output from the comparing means, and then outputting them; and an inverter for inverting the output of said NAND gate.

7. The circuit as claimed in claim 3, wherein said redundancy address generating means comprises:

a plurality of unit fuse circuit comprising:

a fuse one side of which is connected to a supply voltage;

a first NMOS transistor having a gate terminal connected to the other side of said fuse, and drain/source terminals connected to a ground;

a second NMOS transistor having a drain terminal connected to the other side of said fuse, and a source connected to a ground; and an inverter having an input terminal connected the other side of said fuse, and a first output terminal for outputting to said repair decoding means connected to the gate terminal of said second NMOS transistor; and a plurality of inverters connected to the first output terminal of said fuse circuits excluding a random fuse circuit of said plurality of fuse circuits and outputting the inverting signal of said first output terminal to said repair decoding means via a second output terminal.

8. The circuit as claimed in claim 4, wherein said repairing path selection decoding means comprises a plurality of NAND gates for enabling a random repairing path by producing a logic NAND production with the signal output from the redundancy address generating means.

* * * * *